(12) United States Patent
Hollis et al.

(10) Patent No.: US 8,358,151 B2
(45) Date of Patent: *Jan. 22, 2013

(54) RECEIVER CIRCUITRY FOR RECEIVING REDUCED SWING SIGNALS FROM A CHANNEL

(75) Inventors: Timothy M. Hollis, Meridian, ID (US); Bruce W. Schober, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 217 days.

This patent is subject to a terminal disclaimer.

(21) Appl. No.: 12/787,210

(22) Filed: May 25, 2010

(65) Prior Publication Data

US 2010/0231260 A1  Sep. 16, 2010

Related U.S. Application Data

(63) Continuation of application No. 12/106,522, filed on Apr. 21, 2008, now Pat. No. 7,741,873.

(51) Int. Cl.
*H03K 19/094* (2006.01)
(52) U.S. Cl. .......................................... 326/83; 326/68
(58) Field of Classification Search ............... 326/62–74, 326/80–87
See application file for complete search history.

(56) References Cited

U.S. PATENT DOCUMENTS

| | | | |
|---|---|---|---|
| 4,631,426 A | 12/1986 | Nelson et al. | |
| 5,145,799 A | 9/1992 | Rodder | |
| 5,576,639 A | 11/1996 | Park | |
| 5,754,059 A | 5/1998 | Tanghe et al. | |
| 5,999,019 A * | 12/1999 | Zheng et al. | 326/98 |
| 6,201,429 B1 | 3/2001 | Rosenthal | |
| 6,836,148 B2 | 12/2004 | Pullen et al. | |
| 6,879,190 B2 | 4/2005 | Kim et al. | |
| 7,027,276 B2 | 4/2006 | Chen | |
| 8,102,357 B2 * | 1/2012 | Kajiwara et al. | 345/100 |

FOREIGN PATENT DOCUMENTS

KR   10-2001-0005093   1/2001

OTHER PUBLICATIONS

JEDEC Standard JESD8-13, Scalable Low-Voltage Signaling for 400 mV (SLVS-400) (Oct. 2001).
Mobile Industry Processor Interface (MIPI): "MIPI Alliance Specification for D-PHY," ver. 0.90.00 (Oct. 8, 2007).
Wong et al.; "A 27-mW 3.6-Gb/s I/O Transceiver;" IEEE Journal of Solid-State Circuits; vol. 39; No. 4; Apr. 2004; pp. 602-612.

* cited by examiner

*Primary Examiner* — Daniel D Chang
(74) *Attorney, Agent, or Firm* — Schwegman, Lundberg & Woessner, P.A.

(57) ABSTRACT

A receiver for receiving a reduced swing signal from a transmission channel is disclosed, in which the swing of the reduced swing signal is less than the power supply of the receiver and possibly is less than the power supply of the transmitter. The receiver comprises a level shifter for offsetting the reduced swing signal, and an amplifier which receives both the reduced swing signal and its offset to produce a full swing signal output referenced to the power supply of the receiver. The full swing signal can thereafter be buffered, and eventually can be captured by a clock. Optionally, the disclosed reduced swing receiver also contains calibration circuitry for improving the integrity of the full swing signal output, and in particular for countering the effects of process, and in some embodiments temperature, variations, which alter the characteristics of the transistors which make up the receiver circuitry. More particularly, the calibration circuitry compensates for the unbalanced way in which process and temperature variations impact transistors of differing polarities (e.g., n-type and p-type).

42 Claims, 9 Drawing Sheets

RECEIVER CIRCUITRY FOR RECEIVING REDUCED SWING SIGNALS FROM A CHANNEL

CROSS REFERENCE TO RELATED APPLICATIONS

This is a continuation of U.S. patent application Ser. No. 12/106,522, filed Apr. 21, 2008, which is relied upon for priority and which is hereby incorporated by reference in its entirety.

FIELD OF THE INVENTION

Embodiments of this invention relate to a receiver for receiving a reduced swing signal from a transmission channel and for boosting such signal to a logic level compatible swing.

BACKGROUND

Figure 1:
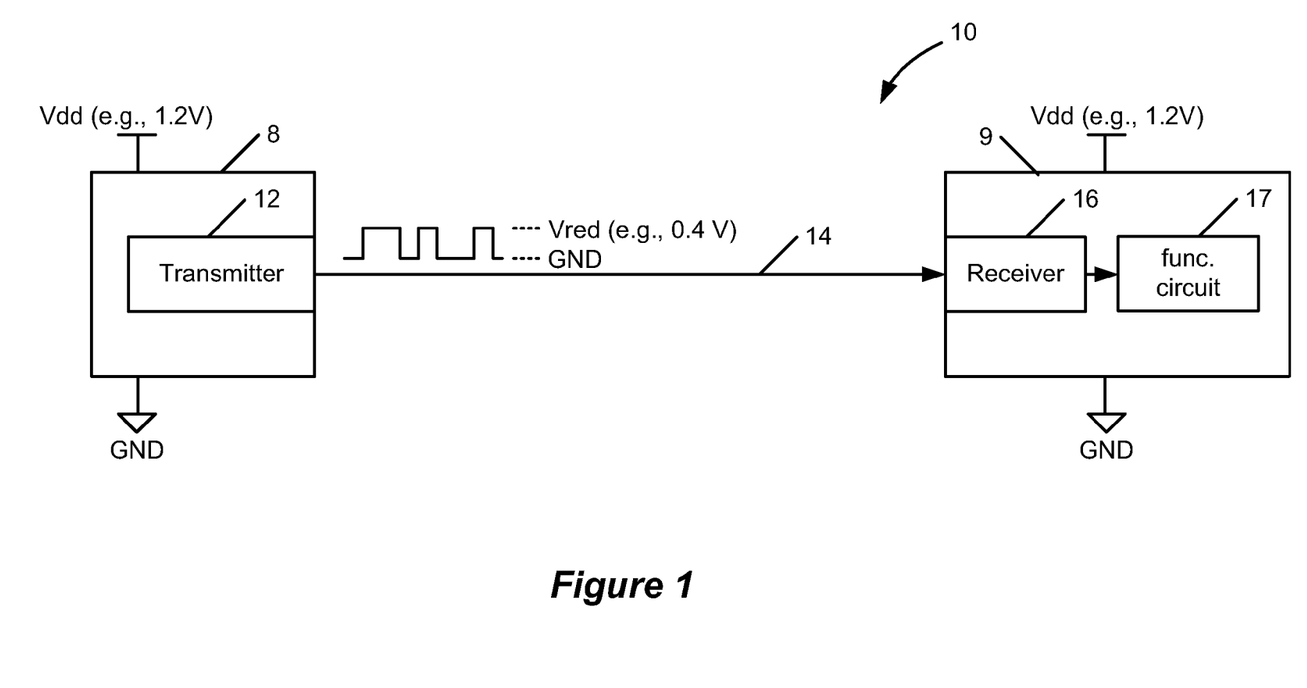
FIG. 1 illustrates a system in which a transmitter at a first circuit transmits a signal to a receiver at a second circuit, in which the signal is transferred at a reduced swing compared with the power supply voltages used at either the transmitter or the receiver.

Transmission of signals (e.g., data, clocks, or other signals) across high-speed chip-to-chip interconnects may take a number of forms. One example illustrating transmission of a signal between high-speed components within a single semiconductor device, or between two devices on a printed circuit board, is represented by the system 10 shown in FIG. 1. In FIG. 1, a transmitter 12 (e.g., in a microprocessor or memory controller 8) sends a signal over a transmission channel 14 (e.g., conductive traces "on-chip" in a semiconductor device or on a printed circuit board) to a receiver 16 (e.g., in another microprocessor or memory 9). The receiver 15 can then send the received signal to a functional circuit 17 within the receiving device 9. For example, receiving device 9 may comprise a Dynamic Random Access Memory (DRAM) integrated circuit, with the functional circuit 17 comprising the memory array of that integrated circuit. One skilled in the art will recognize that typically more than one channel 14 is often present between the devices 8 and 9, forming a bus, but only one such channel 14 is shown for simplicity.

As shown, the devices 8 and 9 and/or the transmitter 12 and receiver 16 are powered by power supply voltages, Vdd and GND (ground). As one skilled in the art will appreciate, digital logic within the devices 8 and 9 will typically be referenced to these power supply voltages, such that a logic '1' bit is represented by Vdd, while a logic '0' is represented by ground or 0 V. In the example shown, the power supply voltage Vdd is equal to 1.2 V in devices 8 and 9, which is a value typical for high-end, modern-day integrated circuits.

It has been recognized that while the transmitting device 8 and receiving device 9 may operate in accordance with a power supply voltage Vdd, it can be beneficial to transmit signals between them on channel 14 having a reduced swing. For example, although both devices 8 and 9 operate with a power supply voltage of 1.2 V, note that the signal being transmitted is referenced to a reduced voltage, Vred, which in the example shown equals 0.4 V. In other words, the signal on the channel 14 swings not across the full power supply voltage range GND to Vdd (e.g., 0 V to 1.2 V) as would be traditional, but instead swings across the reduced voltage range GND to Vred (e.g., 0 V to 0.4 V).

Using a reduced swing to transmit a signal on a transmission channel conserves power. The power consumed by the transmitter 12 in a traditional full swing application is $P=C*Vdd^2*f*N$, where C equals the equivalent output capacitance of, as well as the capacitive loading seen by, the transmitter, f equals the maximum frequency at which switching can occur, and N equals the probability of transition (generally less than or equal to ½ for randomly varying data; but 1 for a clock signal). However, in a reduced swing application, the power consumed by the transmitter 12 equals $P=C*Vdd*Vred*f*N$, which is less than the traditional application by a factor of Vdd/Vred, or 3 in the example shown.

However, while implementing reduced swing signal transmission is helpful from a power consumption standpoint at the transmitting end of the channel, the system must also employ a receiver 16 capable of receiving such a signal with good reliability. This is problematic, because the reduced swing hampers the receiver 16's ability to quickly and accurately resolve the signal. For example, a traditional operational amplifier or sense amplifier could be used for the receiver 16, in a pseudo-differential configuration, with one input comprising the signal from the channel 14, and the other input comprising a reference voltage (Vref) comprising the midpoint of the reduced voltage, Vred/2, or 0.2V. However, when one considers that the reference voltage may vary (say from 0.15V to 0.25V), and the signal may vary from optimal values (say from 0.4 V to 0.35 V for a logic '1' and from 0 V to 0.05 V for a logic '0'), this potentially creates a very small voltage difference window (0.1 V) which the receiver 16 must be capable of resolving. Such a small difference is certainly difficult to resolve in a time frame allowed by the relatively high frequency of the signal. In addition, the relatively low common-mode level of the signal from the channel 14 and the corresponding Vref, falls below the threshold voltage of common n-type devices upon which the pseudo-differential receiver is often based, making such a receiver unable to operate efficiently on the incoming signal. A p-type receiver of the same basic architecture could be employed, as the low common-mode signal levels are suitable for a p-type style receiver, but p-type receivers are notoriously slow, and may not meet the timing requirements of high-speed systems.

Because of the problems using pseudo-differential sensing, one could consider transmitting and receiving both the true and complementary versions of the reduced swing signal, a so-called "fully" differential transmission approach. See, e.g., U.S. patent application Ser. No. 11/972,209, filed Jan. 10, 2008. Such an approach would require a differential receiver to be used, and because the differential data is input into the receiver, the sensing margin would essentially be doubled, allowing for faster, more reliable sensing of the reduced swing signal. However, a differential transmission approach adds complexity and power, and either requires doubling the number of channels 14, or halving the throughput should the same number of channels 14 be retained. Additionally, the "fully" differential receiver would need to be p-type based to cope with the low common-mode signal levels, and as was discussed above, the slow performance of p-type receivers makes them less suitable for the high-speed system.

An alternative would be to let the reduced swing signal start at and come down from the positive supply voltage Vdd (e.g., Vdd-Vred to Vdd). This would shift the common-mode level of the signal higher allowing for an n-type receiver. While this modification would likely perform better in terms of signal integrity, it is a relatively high power solution, as the differential receiver typically requires static DC bias currents and therefore burns power even when no signal is present. This solution would also place undesirable constraints on the system. For example, because the signal swing would be correlated to Vdd, equivalent Vdd levels would be required at both ends of the channel. But in many cases, it is preferable from a power and reliability standpoint to have different Vdd levels at either end of the channel (e.g., when a microprocessor at one end can operate at 1 V while a memory device at the other end requires at least 1.2 V).

Furthermore, the inventors believe the receiver 16 optimally would not merely resolve the received reduced swing signal, but would ultimately boost such signals back to swing levels usable by the receiving device 9, i.e., from 0 to Vdd, i.e., the power supply voltage being used by the receiving device 9. This insures compatibility with the digital logic making up the majority of the remaining circuits on the receiving device 9. The inventors believe such boosting should occur before the signal is captured or latched at the receiving device 9 by a clock signal, such as a clock signal accompanying the reduced swing signal on its own dedicated clock channel. To understand this statement, it is helpful to consider some of the trends in high-speed digital interfaces. In lower speed applications, a forwarded clock not only propagates in parallel with the data being transmitted across the channel, but the clock and data paths are further matched inside the receiving device 9 to insure that any voltage or timing noise impacting either signal will impact both. Careful matching over both paths insures that such noise events cancel out at the point of data capture. With increasing system speeds, however, it has become more difficult to buffer the data as it enters the receiving device 9, and thus matching clock and data paths in the receiving device becomes difficult if not impossible. An alternative method has been to capture data signals immediately as they enter the receiving system, using the forwarded clock which has been distributed out to each of the data ports. This introduces some mismatch in the clock and data paths, and de-correlates the noise between them, reducing the amount of noise cancellation at the point of data capture.

In summary, a reliable, simple receiver 16 useable in a reduced swing transmission scheme is desired, and the inventors realize that such a receiver preferably would be of quick speed; would not involve sensing relying on a Vref; would not involve differential sensing; and would resolve a transmitted signal prior to capture or latching. Examples of such a receiver are disclosed herein.

DETAILED DESCRIPTION

A receiver for receiving a reduced swing signal from a transmission channel is disclosed, in which the swing of the reduced swing signal is less than the power supply of the receiver and possibly is less than the power supply of the transmitter. The receiver comprises a level shifter for offsetting the reduced swing signal, and an amplifier which receives both the reduced swing signal and its offset to produce a full swing signal output referenced to the power supply of the receiver. The full swing signal can thereafter be buffered, and eventually can be captured by a clock. Optionally, the disclosed reduced swing receiver also contains calibration circuitry for improving the integrity of the full swing signal output, and in particular for countering the effects of process, and in some embodiments temperature, variations, which alter the characteristics of the transistors which make up the receiver circuitry. More particularly, the calibration circuitry compensates for the unbalanced way in which process and temperature variations impact transistors of differing polarities (e.g., n-type and p-type).

Figures 2A, 2B:
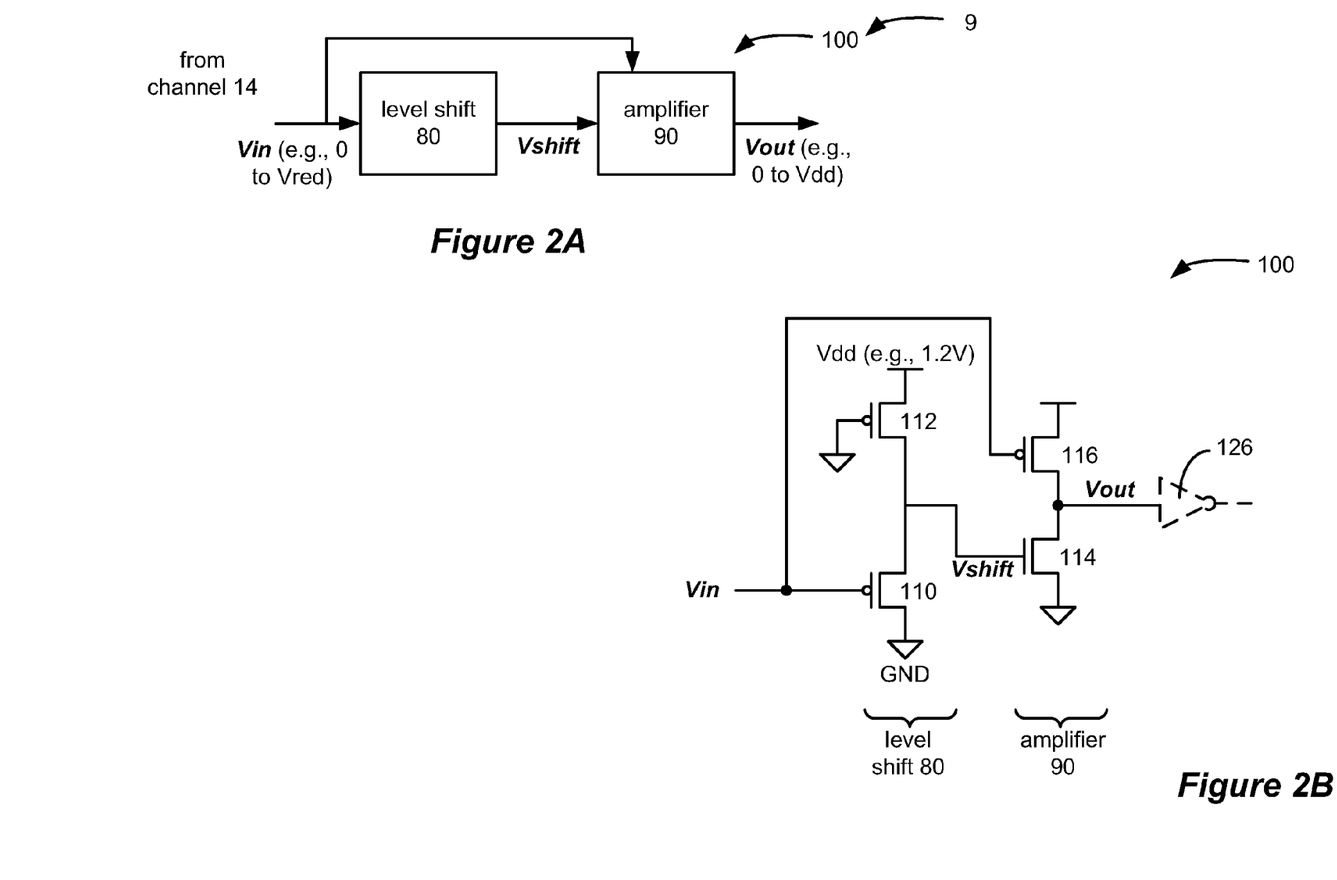
FIGS. 2A and 2B illustrate a first embodiment of a receiver operable to receive the reduced swing signal from the system of FIG. 1.

FIGS. 2A and 2B show a first embodiment of the reduced swing receiver 100 as can be used in the receiving device 9. As shown, the receiver receives a reduced swing signal Vin (e.g., from 0 V to Vred=0.4 V) from a channel 14, and produces full swing signal Vout (e.g., 0 V to Vdd=1.2 V) at its output for use within the receiving device 9.

Figure 3:
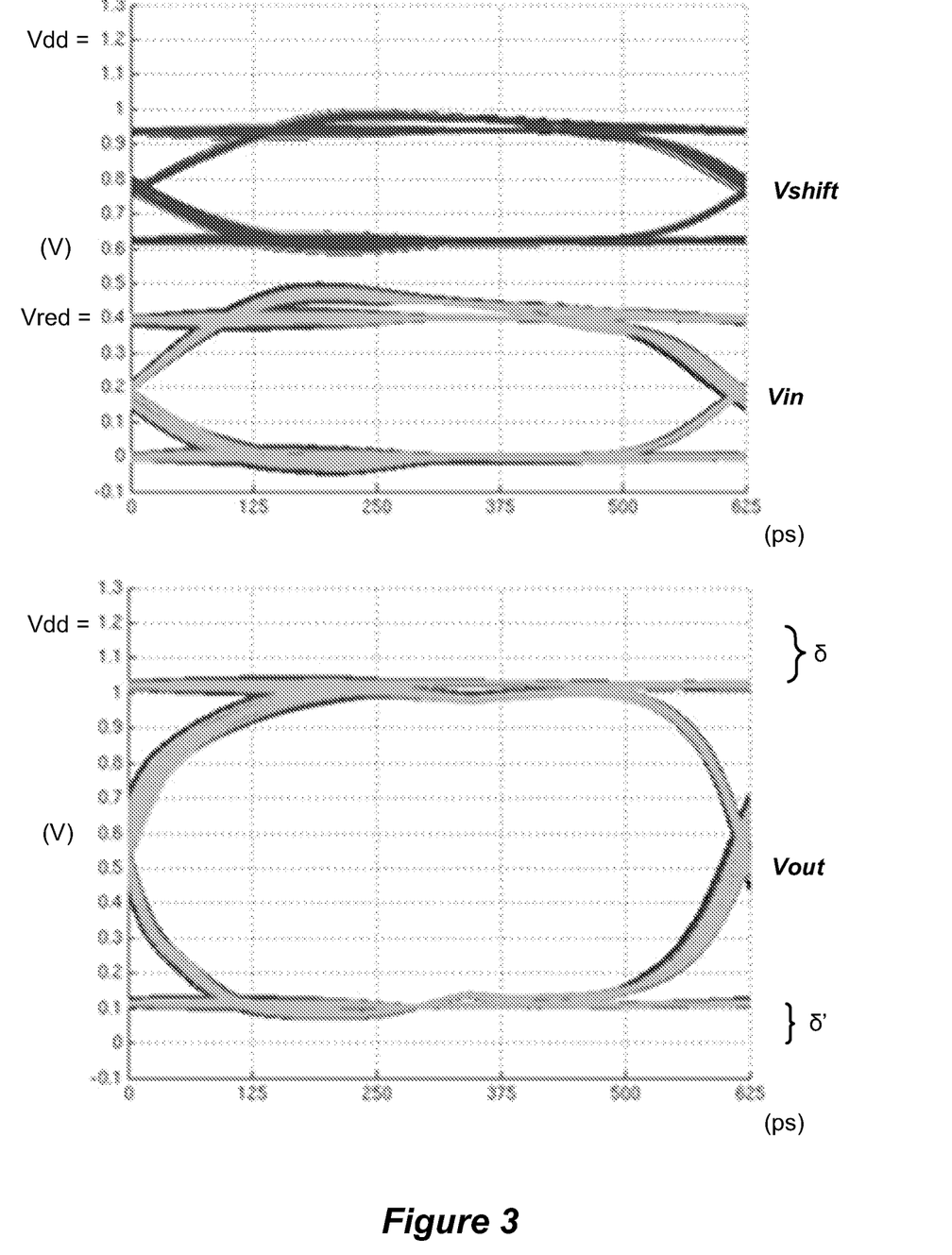
FIG. 3 shows the eye diagrams at various points in the receiver of FIGS. 2A and 2B.

The receiver 100 comprises two basic stages: a level shift stage 80 and an amplifier 90. The level shift stage 80, configured as a source-follower amplifier, essentially upshifts the DC level of the reduced swing input signal Vin to form a new signal, Vshift. This is best shown in the eye diagrams of FIG. 3. As one skilled in the art will appreciate, an eye diagram comprises a circuit trace of a multi-period (usually random) signal continually written into a single period, and usually comprises a practical output of a computer simulation. An eye that appears "open" suggest good signal integrity. As shown at the top of FIG. 3, we see that the eye diagram of signal Vin ranges from approximately 0 V to Vred=0.4 V as specified. Signal Vshift, formed by the level shift stage 80, essentially comprises Vin shifted upward by approximately 0.6 V, i.e., from 0.6 V to 1.0 V, or essentially from approximately ½ Vdd to approximately Vdd. Referring again to FIG. 2B, such level shifting is achieved using P-channel (PCH) transistors 110 and 112, which form a voltage divider with Vshift appearing at the inner tap of the internal terminals of transistors 112 and 114. As shown, the gate of PCH transistor 112 is grounded, such that this transistor is on and essentially acts as a low impedance resistor, or more generally a pull up device. (Note however that this gate can be tied to a different voltage, or even made adjustable, to tune Vshift). Indeed, the PCH transistor 112 can be replaced by a resistor. By contrast, the gate of PCH 110 receives the reduced swing signal, Vin. When Vin=0 V, transistors 112 and 110 essentially equally divide the power supply voltage, Vdd, to produce Vshift=0.6 V. When Vin=0.4 V, PCH transistor 110 is not as strongly on, and therefore comprises a larger resistance when compared with transistor 112, with the result that Vshift rises to equal approximately 1.0 V.

The amplifier 90 in the depicted embodiment uses both Vin and Vshift to produce a full swing output voltage, Vout, commensurate with the power supply voltage Vdd of the receiving device 9. As shown in FIG. 2B, Vshift is sent to the gate of an N-channel (NCH) transistor 114, while Vin is sent to the gate of a PCH transistor 116. When Vin=0 V, Vshift=0.6 V as explained earlier. This causes PCH transistor 116 to be strongly on, and thus of low resistance. By contrast however, NCH 14 is only weakly on, because 0.6V is less than (or at least not sufficiently greater than) the threshold voltage of the NCH transistors. Therefore, the voltage divider formed by transistors 116 and 114 will tend to pull inner tap Vout towards Vdd, for example, to approximately 1.0 V as shown in the bottom eye diagram of FIG. 3. By contrast, when Vin=0.4 V, Vshift=1.0 V as explained earlier. These voltages, when applied to the gates of transistors 116 and 114, result in PCH transistor 116 being only weakly on, while NCH transistor 114 is fully on. Therefore, the voltage divider in this circumstance pulls Vout toward ground, e.g., to approximately 0.1 V, as shown in the bottom eye diagram of FIG. 3.

To summarize the operation of the reduced swing receiver 100, when Vin=0 V, Vout=1.0 V, i.e., essentially the full power supply voltage Vdd=1.2 V (in reality, Vdd−δ, as shown in FIG. 3). When Vin=0.4 V, Vout=0.1 V, i.e., essentially ground (in reality, δ', as shown in FIG. 3). Therefore, notice that the receiver 100 resolves the received reduced swing signal and boosts it up essentially to full swing levels, but in inverted fashion. Should it be desired to pass non-inverted data from the receiver 100 to the receiving device 9, an optional inverter 126 can be used. Use of an inverter 126 is beneficial, not only to restore the received signal to its true data state, but also to buffer Vout to produce a true full swing level signal. In other words, by using inverter 126 (or any other buffer), δ and δ' can be removed from the signal such that it ranges from 0 V to 1.2 V, not merely 0.1 V to 1.0 V. Having said this, Vout still comprises a usable output on its own, as evidenced by the nicely-opened eye diagram illustrated at the bottom of FIG. 3. In any event, 0.1 V and 1.0 V are not materially different from ground and Vdd from a functional standpoint, and so can be said to be at ground and Vdd.

While one embodiment of the level shift stage 80 is provided, several possibilities exist for achieving the same goal of upshifting the common-mode signal level, which are familiar to those skilled in the art. The embodiment shown is preferable in that it requires a comparatively low amount of current to accomplish the task. Other types of level conversion are possible. See, e.g., Hui Zhang et al., "Low-Swing On-Chip Signaling Techniques: Effectiveness and Robustness," IEEE Trans. On VLSI, Vol. 8, No. 3 (June 2000).

Figure 4:
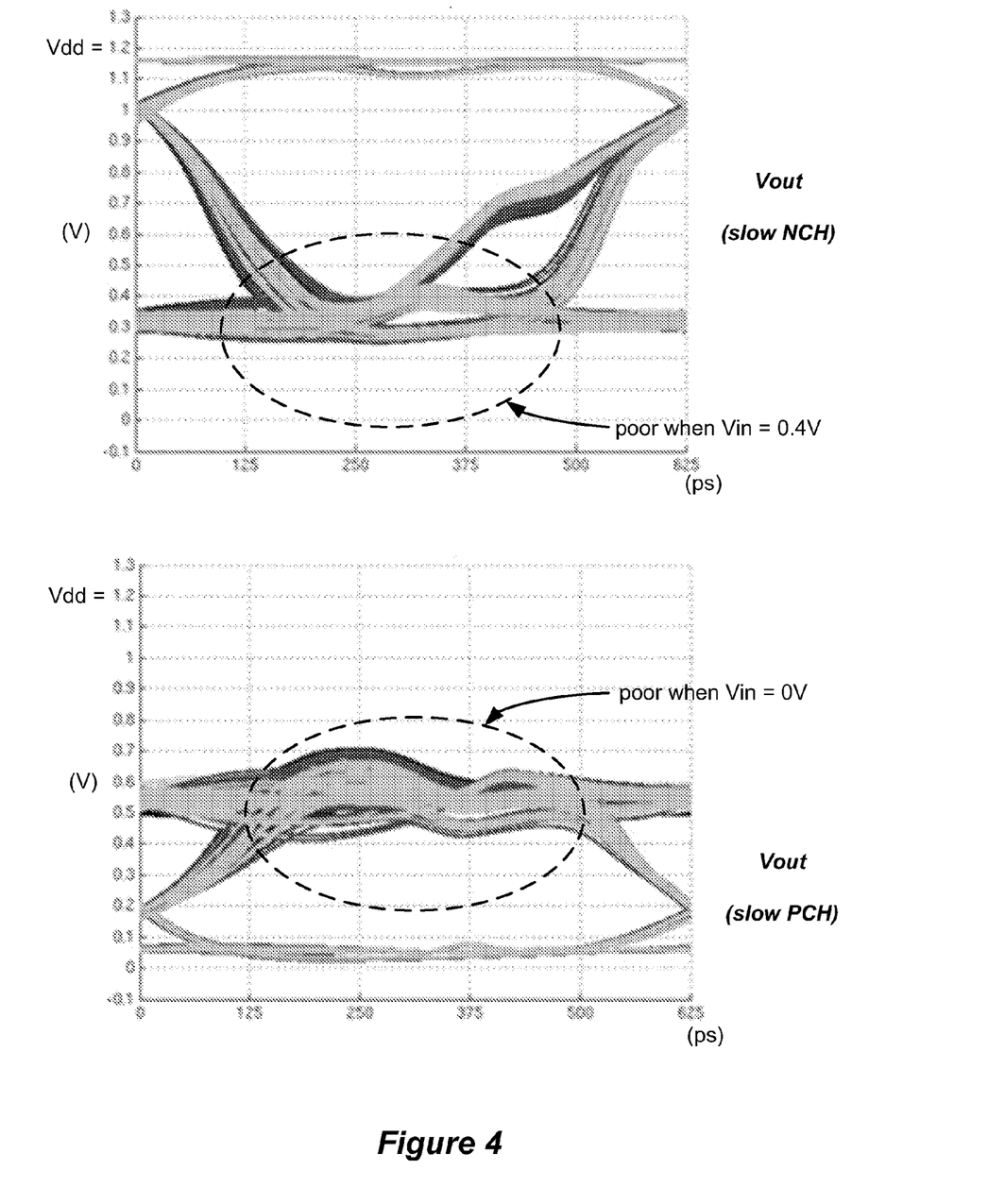
FIG. 4 shows the eye diagrams at various points in the receiver of FIGS. 2A and 2B in the conditions where the N-channel transistors are relatively slow and where the P-channel transistors are relatively slow.

Simulation shows that the disclosed reduced swing receiver 100 can be sensitive to processing variations. Specifically, because the voltage dividers in both the level shifter stage 80 (i.e., transistors 112 and 110) and the amplifier 90 (i.e., transistors 116 and 114) operate through exploitation of the threshold voltages (Vt) of the transistors, changes in the threshold voltages of the transistors can cause the circuit to operate non-optimally. For example, if the NCH transistors have unusually high Vts, as a result of some processing variation, the NCH transistors are said to be relatively "slow" compared to the PCH transistors. By contrast, if the PCH transistors have unusually high Vts, as a result of some processing variation, the PCH transistors are said to be relatively slow compared to the NCH transistors. FIG. 4 shows eye diagrams of the simulations resulting from hypothetical "slow NCH" and "slow PCH" operation. Notice in the slow NCH case, reception is poor when Vin=0.4 V, i.e., when Vout should be close to 0 V. In the slow PCH case, reception is poor when Vin=0 V, i.e., when Vout should be close to Vdd. In either case, the eye begins to collapse, which impedes the ability of the receiver 100 to accurately report data to the receiving device 9.

Figure 5A:
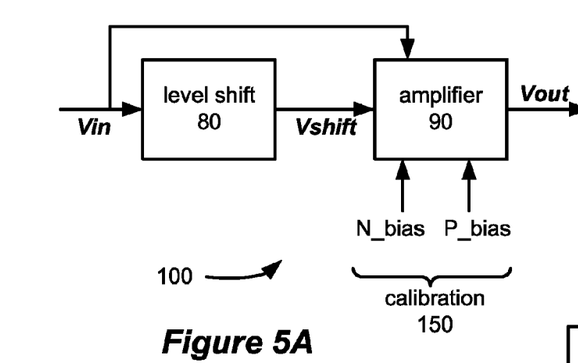
FIGS. 5A and 5B illustrate a second embodiment of a receiver operable to receive the reduced swing signal from the system of FIG. 1, in which calibration is included to overcome the slowness of the transistors in FIG. 4, and in which calibration is integrated with amplification in the receiver.
Figure 5B:
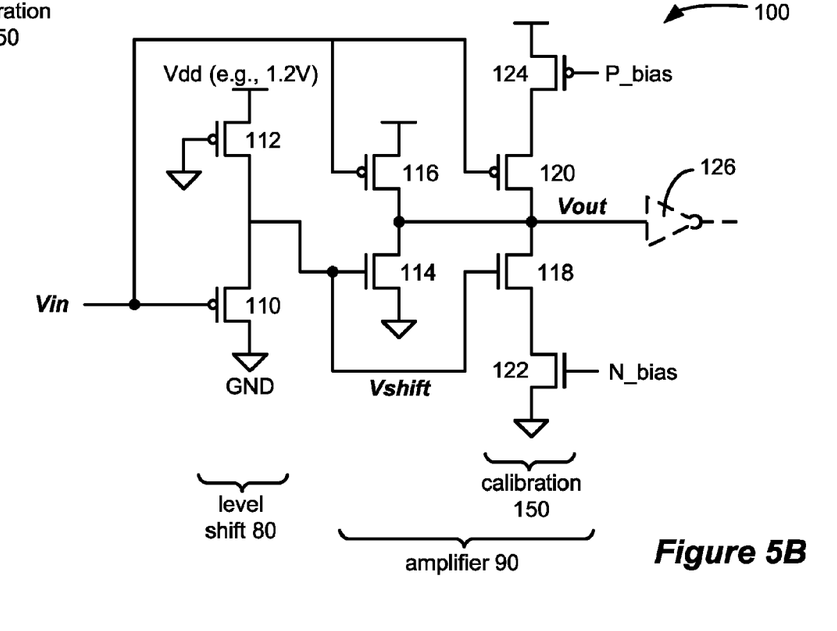

While such sensitivity may rarely be problematic, and can be kept in check by controlling the fabrication process and/or operating conditions, additional and optional calibration circuitry can also be used to offset such relative mismatches or imbalance between the NCH and PCH processes used on a given device. One example of calibration circuitry, useable in the disclosed reduced swing receiver 100, is shown in FIGS. 5A and 5B. As shown, an optional calibration stage 150 has been added, which comprises two PCH transistors 124 and 120, and two NCH transistors 118 and 120. Transistors 120 and 118, are coupled to Vin and Vshift respectively, just like their counterpart transistors 116 and 114. Transistors 124 and 122 are respectively controlled by calibration signals P-bias and N-bias, which are derived by circuits such as those shown in FIGS. 6A and 6B.

Before discussing the derivation of calibration signals P_bias and N_bias, their operation in trimming the output of the reduced swing receiver 100 is explained with reference to FIG. 5B. Calibration signal P_bias is asserted (active low) when the PCH transistors are relatively slow. Conversely, calibration signal N_bias is asserted (active high) when the NCH transistors are relatively slow. When P_bias is asserted, transistor 124 turns on, which allows Vout to more easily be drawn toward Vdd, thus overcoming the condition shown at the bottom of FIG. 4. When N_bias is asserted, transistor 122 turns on, which allows Vout to more easily be drawn toward ground, thus overcoming the condition shown at the top of FIG. 4.

Figure 6A:
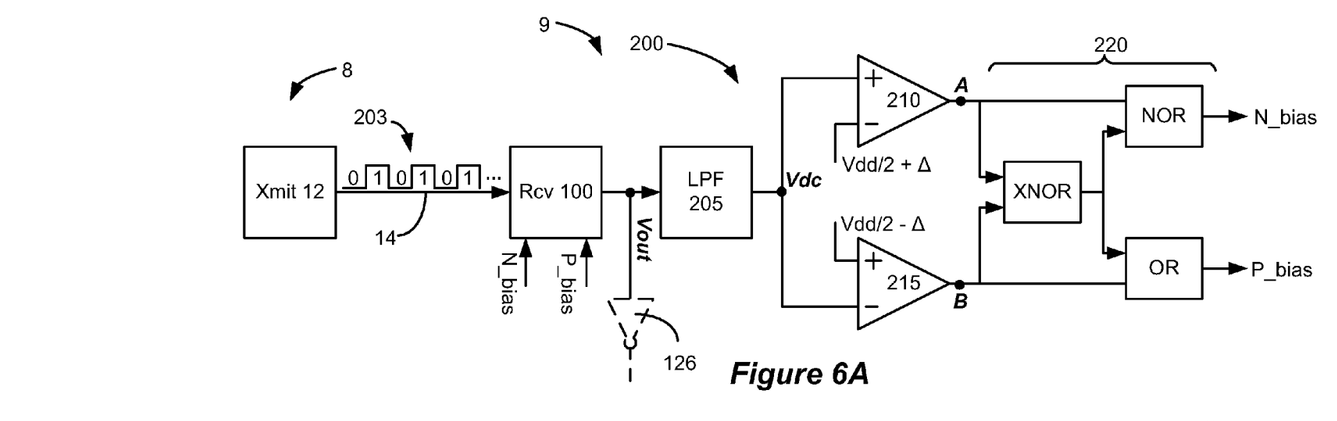
FIGS. 6A and 6B illustrate embodiments by which the receiver of FIGS. 5A and 5B can be calibrated.
Figure 6B:
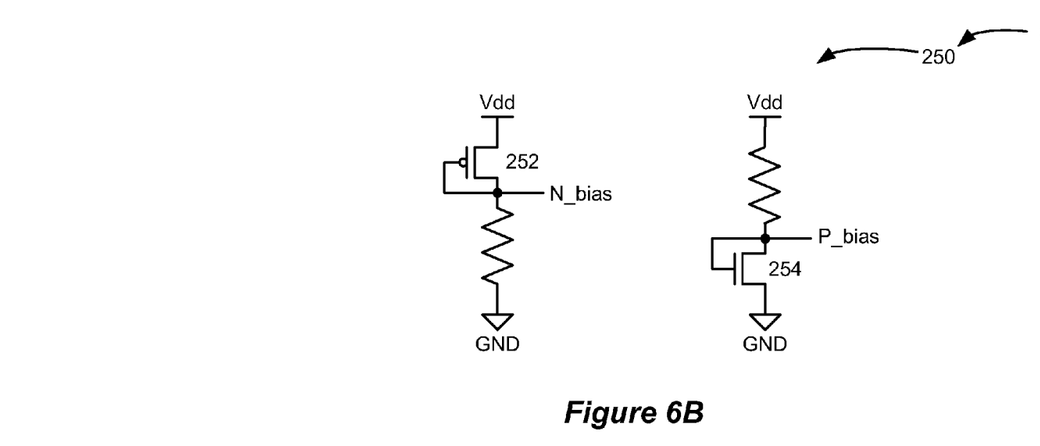

As will be seen shortly with respect to FIGS. 6A and 6B, assertion of these signals can be absolute or a matter of degree. For example, the calibration signals can be digital in nature, such that full logic levels '0' (GND) and '1' (Vdd) are presented to the gates of transistors 124 and 122; in such an arrangement N_bias is asserted as a logic '1', thus turning on transistor 122, while P_bias is asserted as a logic '0', thus turning on transistor 124. Alternatively, the calibration signals can be analog in nature. For example, N_bias and P_bias may range in smooth fashion from 0 V to Vdd, which would turn on transistors 122 and 124 to varying degrees. Moreover, the calibration signals P_bias and N_bias may be learned by a training algorithm prior to useful operation of the receiver, or can be made to vary in real time during useful operation of the receiver.

Example circuitry 200, for generating digital calibration signals for the reduced swing receiver 100, is shown in FIG. 6A. In this example, calibration circuitry 200 is activated and used to set the calibration signals N_bias and P-bias prior to useful operation of receiver 100. Such a scheme requires participation of the transmitter 12 in the transmitting device 8, which issues a test signal 203. In the example shown, test signal 203 comprises an alternating, reduced swing clock signal. This test signal 203 is then received at the reduced swing receiver 100, which renders a full swing output, Vout, as discussed earlier.

Bypassing any sort of buffering, such as that provided by inverter 126, the output Vout is sent to a low pass filter (LPF) 205, which essentially averages Vout to a DC level, Vdc. If the NCH and PCH transistors are well matched, the eye diagram for Vout should be nicely open and well balanced (as shown at the bottom of FIG. 3), with the result that Vdc should approximately equal Vdd/2. If the NCH transistors are relatively slow, the eye diagram will be skewed to higher values (as shown at the top of FIG. 4), and Vdc will drift upwards to a value of >Vdd/2. Likewise, if the PCH transistors are relatively slow, the eye diagram will be skewed to lower values (as shown at the bottom of FIG. 4), and Vdc will drift downward to a value of <Vdd/2.

This value for Vdc is sent to two operational amplifiers (op amps) 210 and 215, configured as a "windowed" comparator, to assess its value and assert the calibration signals P_bias and N_bias if necessary. Essentially, the two op amps 210 and 215 define three possibilities for Vdc. First, Vdc can be within a tolerable range of deviation, i.e., from Vdd/2−Δ to Vdd/2+Δ. Assuming Vdd to equal 1.2 V, and allowing for a small offset of Δ equal to 0.15 V, a tolerable range might be 0.45<Vdc<0.75. If Vdc is in this tolerable range, neither op amp output, A or B, is asserted. If Vdc>0.75 V, suggesting relatively slow NCH transistors, then output A will be asserted. If Vdc<0.45 V, suggesting relatively slow PCH transistors, then output B will be asserted.

The outputs A and B are input into a logic block 220 to derive the digital calibration signals P_bias and N_bias. One skilled in the art will understand the operation of the various logic gates in logic block 220, and so the details of such logic are not further discussed. If A=B='0', meaning that Vdc is within the tolerable range, then N_bias='0', and P_bias='1', meaning (when one remembers that P_bias is active low) that neither N_bias nor P_bias is asserted. If A='1' and B='0', meaning that Vdc is too high, then N_bias='1' and P_bias='1', meaning that only N_bias is asserted. If A='0' and B='1', meaning that Vdc is too low, then N_bias='0' and P_bias='0', meaning that only P_bias is asserted.

These derived values for calibration signals P_bias and N_bias are then fed back to the reduced swing receiver 100 during useful operation to help adjust the skew resulting from the PCH to NCH mismatch. Thus, and referring again to FIG. 5B, when Vdc is too high, N_bias is asserted to turn on transistor 122, which pulls Vout to lower values and helps to open the eye diagram. When Vdc is too low, P_bias is asserted to turn on transistor 124, which pulls Vout to higher values and helps to open the eye diagram. When Vdc is in the tolerable range, neither N_bias nor P_bias is asserted.

As noted earlier, calibration signals P_bias and N_bias can also be analog in nature, and calibration circuitry 250 of FIG. 6B illustrates how such signals can be generated in accordance with one embodiment. In this example, circuitry 250 comprises passive circuitry for setting calibration signals P_bias and N_bias to appropriate levels. In this arrangement, calibration circuitry comprises diode-resistor series circuits for generating N_bias and P-bias. Given the gate to terminal connection, one skilled in the art will appreciate that the transistors 252 and 254 operate as diodes having a threshold voltage roughly equaling the threshold voltage of the transistors. By sizing the diode-connected transistors in a manner representative of the corresponding amplifying transistors, the Vts of the diode-connected transistors should track the Vts of the amplifying transistors. (The sizes do not need to be equivalent in the amplifier and the calibration circuitry, but that is one possibility.) Therefore, if the NCH transistors such as transistor 254 are relatively slow, P_bias will be relatively high, which will tend to weaken transistor 124 (FIG. 5B), which in turn allows Vout to drift to lower levels, thus mitigating the circumstance illustrated at the top of FIG. 4. By contrast, if the PCH transistors such as transistor 252 are relatively slow, N_bias will be relatively low, which will tend to weaken transistor 122 (FIG. 5B), which in turn allows Vout to drift to higher levels, thus mitigating the circumstance illustrated at the bottom of FIG. 4. Note that this analog means of calibrating the reduced swing receiver 100 doesn't require training or participation by the transmitter, making it simple to implement. However, the calibration circuitry 250 will draw some current, and so is less considerate of power consumption in the receiving device 9. That being said, use of large resistors R, e.g., 50 kΩ, can keep current draw to tolerable levels. Such circuitry also compensates for the impact of temperature variation on the Vts of the transistors.

Figures 7A, 7B:
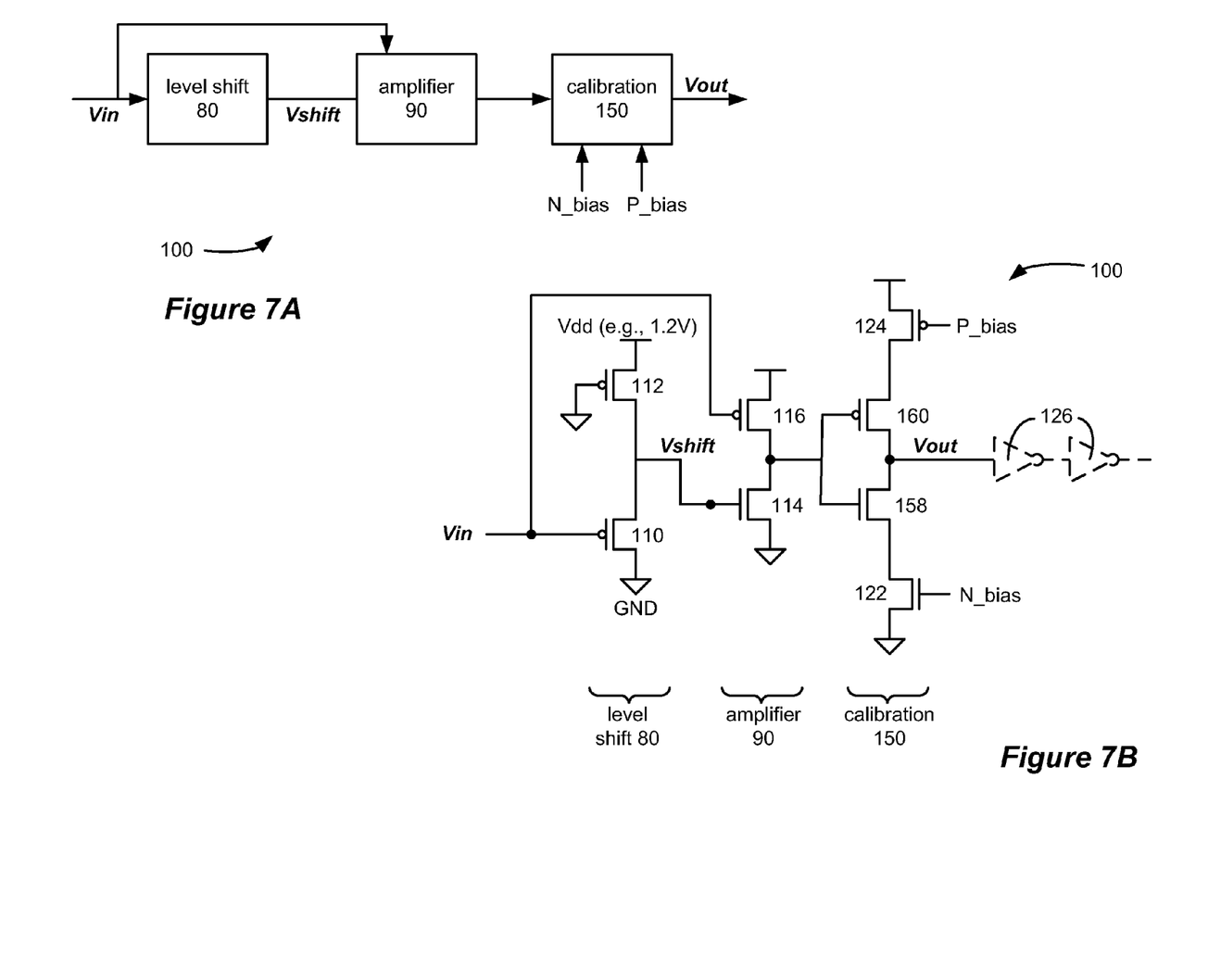
FIG. 7 illustrates a third embodiment of a receiver operable to receive the reduced swing signal from the system of FIG. 1, in which calibration is included to overcome the slowness of the transistors in FIG. 4, and in which calibration is discrete from the amplification in the receiver.

FIG. 7 shows yet another calibration approach in which calibration is discrete from the amplifier circuit 90, as opposed to being integrated with the amplifier circuit, as was the case in FIGS. 5A and 5B. In FIG. 7, the output of the amplifier 90 (which again can be skewed as shown in FIG. 4 due to a NCH/PCH mismatch) is coupled to the gates of transistors 160 and 158, which one skilled in the art will recognize as an inverter. Similar to the calibration stage 150 in FIG. 5B, the calibration transistors 124 and 122 are used to more strongly or more weakly couple the output, Vout, to either ground or the power supply voltage, Vdd, and in so doing alleviate problems associated with processing variations just as those described earlier with respect to FIG. 4. Note that the calibration signals N_bias and P_bias can be derived using the techniques of FIGS. 6A and 6b, or by other means.

While FIGS. 5-7 illustrate various ways in which the reduced swing receiver can be calibrated or trimmed, it should be noted that such merely constitute some working examples, and that other calibration schemes could be used as well.

Whether calibrated or not, it should be evident that the disclosed reduced swing receiver 100 has significant advantages in a reduced swing transmission system. First, unlike sensing schemes relying on a mid-point reference voltage, the disclosed reduced swing receiver 100 operates in accordance with a full reduced swing (e.g., 0.4 V), which improves sensing margin and allows the receiver to act faster and more reliably. In other words, margin is not lost due to Vref variation. The disclosed design additionally has been simulated to be operable even at traditional transistor threshold voltage levels, despite the reduced swing of the incoming signals. The disclosed design also ultimately boosts the received signals back to full swing levels usable by the receiving device 9, i.e., from 0 to Vdd, i.e., the power supply voltage being used by the receiving device 9. Such boosting occurs before the signal is captured or latched at the receiving device 9 by a clock signal, which as noted earlier has benefits, such as increased noise cancellation at the point of data capture. One additional benefit of the disclosed design worth mentioning is that it does not require the power supply voltages, Vdd, to be the same at both the transmitting device 8 and the receiving device 9. Finally, the disclosed reduced swing receiver 100 not only handles the low common-mode level of the reduced swing signal, but it has sufficient bandwidth to buffer data as it enters the receiving system, which enables matched clock and data paths at low to moderate (Gigabit/second) data rates.

Figure 8:
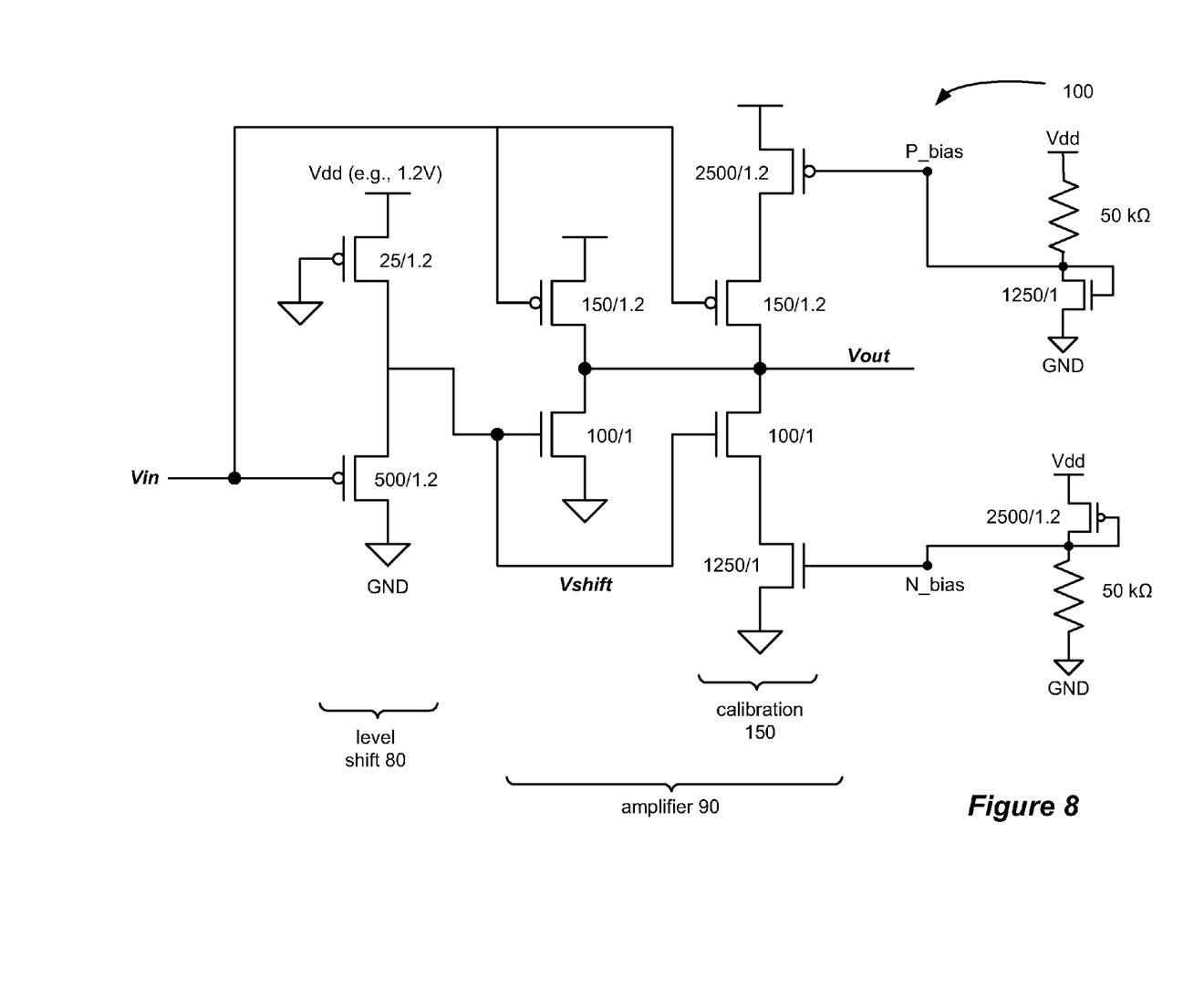
FIG. 8 illustrates the reduced swing receiver of FIG. 5B and the analog calibration circuit of FIG. 6B complete with transistor dimensions and resistances where applicable.

To provide further details of a working example of the disclosed reduced swing receiver 100, the calibrate-able receiver 100 of FIG. 5B, along with analog calibration circuits from FIG. 6B, are redrawn in FIG. 8. The widths and lengths of the various transistors used in the circuitry are shown in traditional format (i.e., W/L), where a value of 1 represents the smallest patternable size for the process involved (e.g., a 90 nm process).

Figure 9A:
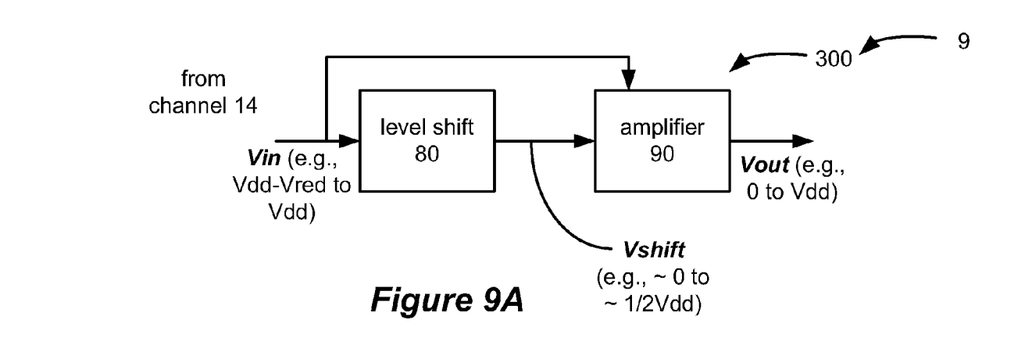
FIGS. 9A and 9B illustrates another embodiment of the disclosed reduced swing receiver in which the reduced swing signal from the channel ranges from Vdd-Vred to Vdd.
Figure 9B:
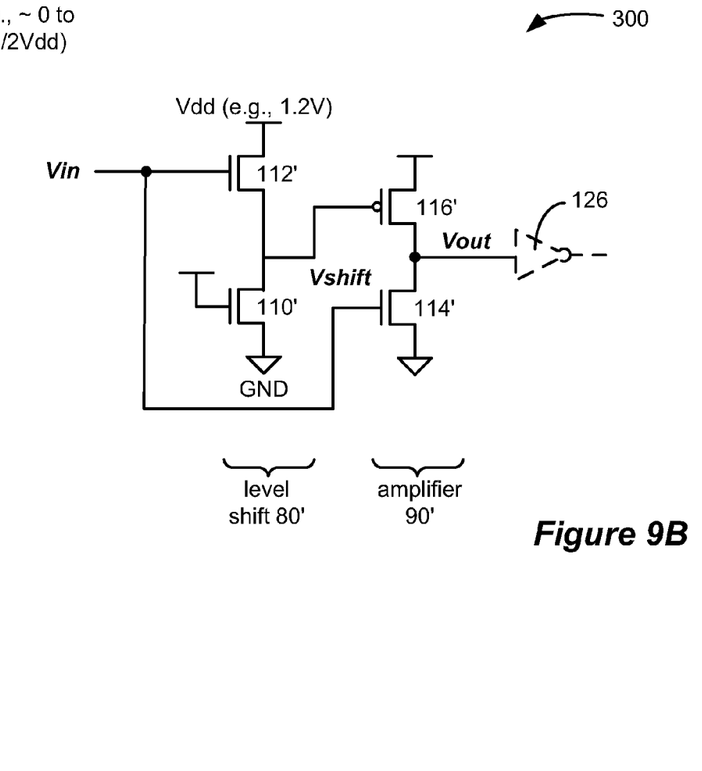

FIGS. 9A and 9B shows another embodiment of the reduced swing receiver 300. In this embodiment, a reduced swing signal is processed, but the swing in the signal occurs with reference to the top (higher) power supply voltage. In other words, the input signal ranges from Vdd-Vred to Vdd, which using the values introduced earlier comprises a swing from 0.8 V to 1.2 V. Because the reduced swing signal is referenced to the higher power supply voltage (Vdd) instead of the lower power supply voltage (i.e., GND), and transistors 112' and 110' are changed to NCH transistors in the level shifter 80', with transistor 110' acting as a pull down device (e.g., a resistor). So configured, the inner tap of the voltage divider, Vshift, varies from between approximately 0V and approximately ½ Vdd or 0.6 V. The reduced swing signal and Vshift are respectively presented to PCH transistor 114' and NCH transistor 116' in the amplifier stage, with the result that the output signal, Vout, ranges from approximately 0V to approximately Vdd.

Although the reduced swing signals disclosed herein range between ground and Vred (e.g., FIG. 2B), or between Vdd-Vred and Vdd (FIG. 9B), it should be recognized that these are merely exemplarily, and that a reduced swing signal may be relative to either the higher (e.g., Vdd) or lower (e.g., GND) power supply voltages, which values can take on non-traditional or even negative values.

Although the various embodiments of the reduced swing receivers illustrated herein are illustrated as implemented with MOSFET transistors, bipolar transistors could be used as well to form the various PCH and NCH transistors mentioned herein.

While preferred embodiments of the invention have been disclosed, it should be understood that the disclosed circuitry can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A receiver configured to receive a signal from a channel, comprising:
   a first PCH transistor configured to receive the signal at its gate, wherein the PCH transistor is coupled to a third voltage at its first terminal and is coupled to a node at its second terminal;
   a pull up device coupled to a second voltage at its first terminal and coupled to the node at its second terminal;
   a second PCH transistor configured to receive the signal at its gate, wherein the second PCH transistor is coupled to the second voltage at its first terminal, and is coupled to an output at its second terminal; and
   an NCH transistor configured to receive the node at its gate, wherein the NCH transistor is coupled to the third voltage at its first terminal and is coupled to the output at its second terminal.

2. The receiver of claim 1, further comprising an inverter coupled to the output.

3. The receiver of claim 1, further comprising a calibrator coupled to the output for trimming the output.

4. The receiver of claim 3, wherein the calibrator calibrates prior to useful operation of the receiver.

5. The receiver of claim 3, wherein the calibrator calibrates during useful operation of the receiver.

6. The receiver of claim 3, wherein the calibrator compensates for an imbalance between transistors of opposite polarities in the receiver.

7. The receiver of claim 3, wherein the calibrator is configured to pull up the output upon assertion of a pull up calibration signal, and to pull down the output upon assertion of a pull down calibration signal.

8. The receiver of claim 7, wherein the pull up and pull down calibration signals are digital.

9. The receiver of claim 7, wherein the pull up and pull down calibration signals are analog.

10. A receiver configured to receive a signal from a channel, comprising:
    a first NCH transistor configured to receive the signal at its gate, wherein the first NCH transistor is coupled to a second voltage at its first terminal and is coupled to a node at its second terminal;
    a pull down device coupled to a third voltage at its first terminal and coupled to the node at its second terminal;
    a second NCH transistor configured to receive the signal at its gate, wherein the second NCH transistor is coupled to the third voltage at its first terminal, and is coupled to an output at its second terminal; and
    a PCH transistor configured to receive the node at its gate, wherein the PCH transistor is coupled to the second voltage at its first terminal and is coupled to the output at its second terminal.

11. The receiver of claim 10, further comprising an inverter coupled to the output.

12. The receiver of claim 10, further comprising a calibrator coupled to the output for trimming the output.

13. The receiver of claim 12, wherein the calibrator calibrates prior to useful operation of the receiver.

14. The receiver of claim 12, wherein the calibrator calibrates during useful operation of the receiver.

15. The receiver of claim 12, wherein the calibrator compensates for an imbalance between transistors of opposite polarities in the receiver.

16. The receiver of claim 12, wherein the calibrator is configured to pull up the output upon assertion of a pull up calibration signal, and to pull down the output upon assertion of a pull down calibration signal.

17. The receiver of claim 16, wherein the pull up and pull down calibration signals are digital.

18. The receiver of claim 16, wherein the pull up and pull down calibration signals are analog.

19. A receiver configured to receive a reduced swing signal from a channel, comprising:
    a level shifter configured to receive the reduced swing signal and to produce a level shifted version of the reduced swing signal, wherein the reduced swing signal ranges between a first voltage and a second voltage;
    an amplifier configured to receive the reduced swing signal at a gate of a transistor of a first polarity and the level shifted version of the reduced swing signal at a gate of a transistor of a second polarity and to produce an output, wherein the output comprises a version of the reduced swing signal which ranges between the second voltage and a third voltage, wherein the first voltage is between the second voltage and the third voltage; and
    a calibrator for trimming the output.

20. The receiver of claim 19, wherein the level shifter is formed of a series connection of transistors.

21. The receiver of claim 19, wherein the calibrator compensates for an imbalance between transistors of opposite polarities in the receiver.

22. The receiver of claim 19, wherein the calibrator is configured to receive the reduced swing signal.

23. The receiver of claim 19, wherein the calibrator is configured to pull up the output upon assertion of a pull up calibration signal, and to pull down the output upon assertion of a pull down calibration signal.

24. The receiver of claim 23, wherein the pull up and pull down calibration signals are digital.

25. The receiver of claim 24, wherein the pull up and pull down calibration signals are generated by a comparator circuit.

26. The receiver of claim 25, wherein the comparator circuit is configured to receive a test signal including logic '1' bit and logic '0' bits.

27. The receiver of claim 23, wherein the pull up and pull down calibration signals are analog.

28. The receiver of claim 27, wherein the pull up calibration signal is generated by a first passive circuit, and wherein the pull down calibration signal is generated by a second passive circuit.

29. The receiver of claim 28, wherein the first passive circuit comprises a series connection of a first diode and a first resistor, and wherein the pull up calibration signal is generated at a node between the first diode and the first resistor, and wherein the second passive circuit comprises a series connection of a second diode and a second resistor, and wherein the pull down calibration signal is generated at a node between the second diode and the second resistor.

30. The receiver of claim 19, wherein the calibrator comprises an inverter configured to receive the output, and wherein the inverter is respectively coupled to power and ground by adjustable pull and pull down transistors.

31. A receiver configured to receive a reduced swing signal from a channel, comprising:
a first voltage divider configured to receive the reduced swing signal and to produce an intermediate signal at a first inner tap, wherein the reduced swing signal ranges between a first voltage and a second voltage;
a second voltage divider configured to receive the reduced swing signal at a gate of a transistor of a first polarity and the intermediate signal at a gate of a transistor of a second polarity and to produce an output at a second inner tap, wherein the output comprises a version of the reduced swing signal which ranges between the second voltage and a third voltage, wherein the first voltage is between the second voltage and the third voltage; and
a calibrator for trimming the output.

32. The receiver of claim 31, wherein the first voltage divider is formed of a series connection of transistors.

33. The receiver of claim 31, wherein the calibrator compensates for an imbalance between transistors of opposite polarities in the receiver.

34. The receiver of claim 31, wherein the calibrator is configured to receive the reduced swing signal.

35. The receiver of claim 31, wherein the calibrator is configured to pull up the output upon assertion of a pull up calibration signal, and to pull down the output upon assertion of a pull down calibration signal.

36. The receiver of claim 35, wherein the pull up and pull down calibration signals are digital.

37. The receiver of claim 36, wherein the pull up and pull down calibration signals are generated by a comparator circuit.

38. The receiver of claim 37, wherein the comparator circuit is configured to receive a test signal including logic '1' bit and logic '0' bits.

39. The receiver of claim 35, wherein the pull up and pull down calibration signals are analog.

40. The receiver of claim 39, wherein the pull up calibration signal is generated by a first passive circuit, and wherein the pull down calibration signal is generated by a second passive circuit.

41. The receiver of claim 40, wherein the first passive circuit comprises a series connection of a first diode and a first resistor, and wherein the pull up calibration signal is generated at a node between the first diode and the first resistor, and wherein the second passive circuit comprises a series connection of a second diode and a second resistor, and wherein the pull down calibration signal is generated at a node between the second diode and the second resistor.

42. The receiver of claim 31, wherein the calibrator comprises an inverter configured to receive the output, and wherein the inverter is respectively coupled to power and ground by adjustable pull and pull down transistors.

* * * * *

UNITED STATES PATENT AND TRADEMARK OFFICE
CERTIFICATE OF CORRECTION

PATENT NO. : 8,358,151 B2
APPLICATION NO. : 12/787210
DATED : January 22, 2013
INVENTOR(S) : Timothy M. Hollis et al.

It is certified that error appears in the above-identified patent and that said Letters Patent is hereby corrected as shown below:

In column 11, line 24, in Claim 30, delete "pull and" and insert -- pull up and --, therefor.

In column 12, line 37, in Claim 42, delete "pull and" and insert -- pull up and --, therefor.

Signed and Sealed this
Ninth Day of April, 2013

Teresa Stanek Rea
*Acting Director of the United States Patent and Trademark Office*